(12) United States Patent
de Souza et al.

(10) Patent No.: US 9,620,592 B2
(45) Date of Patent: Apr. 11, 2017

(54) DOPED ZINC OXIDE AND N-DOPING TO REDUCE JUNCTION LEAKAGE

(71) Applicant: INTERNATIONAL BUSINESS MACHINES CORPORATION, Armonk, NY (US)

(72) Inventors: Joel P. de Souza, Putnam Valley, NY (US); Keith E. Fogel, Hopewell Junction, NY (US); Jeehwan Kim, Los Angeles, CA (US); Siegfried L. Maurer, Stormville, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/620,885

(22) Filed: Feb. 12, 2015

(65) Prior Publication Data

US 2016/0240620 A1 Aug. 18, 2016

(51) Int. Cl.
| | |
|---|---|
| *H01L 29/08* | (2006.01) |
| *H01L 29/78* | (2006.01) |
| *H01L 29/66* | (2006.01) |
| *H01L 29/45* | (2006.01) |
| *H01L 29/26* | (2006.01) |

(Continued)

(52) U.S. Cl.
CPC ........ *H01L 29/0847* (2013.01); *H01L 21/246* (2013.01); *H01L 29/26* (2013.01); *H01L 29/267* (2013.01); *H01L 29/45* (2013.01); *H01L 29/452* (2013.01); *H01L 29/66522* (2013.01); *H01L 29/66628* (2013.01); *H01L 29/78* (2013.01)

(58) Field of Classification Search
CPC .............. H01L 2924/1037–2924/10381; H01L 2924/1032–2924/1036; H01L 29/26; H01L 29/267; H01L 29/263; H01L 26/0847
See application file for complete search history.

(56) References Cited

U.S. PATENT DOCUMENTS

| | | | | |
|---|---|---|---|---|
| 4,958,203 A | * | 9/1990 | Takikawa ............ | H01L 29/7787 257/194 |
| 5,352,628 A | * | 10/1994 | Funaba ............... | H01L 21/2258 257/E21.152 |

(Continued)

FOREIGN PATENT DOCUMENTS

| | | |
|---|---|---|
| JP | 05029354 A | 2/1993 |
| JP | 3084820 B2 | 9/2000 |
| JP | 3488137 B2 | 1/2004 |

OTHER PUBLICATIONS

Manik, P., et al. "Indium tin oxide (ITO) and Al-doped ZnO (AZO) interfacial layers for Ohmic contacts on n-type Germanium" 72nd Annual Device Research Conference (DRC). Jun. 2014. (2 Pages).

*Primary Examiner* — Phat X Cao
*Assistant Examiner* — Diana C Vieira
(74) *Attorney, Agent, or Firm* — Tutunjian & Bitetto, P.C.; Louis Percello

(57) ABSTRACT

A semiconductor device includes a substrate and a p-doped layer including a doped III-V material on the substrate. An n-doped layer is formed on the p-doped layer, the n-doped layer including a doped III-V material. A contact interface layer is formed on the n-doped layer. The contact interface layer includes a II-VI material. A contact metal is formed on the contact interface layer to form an electronic device.

20 Claims, 6 Drawing Sheets

(51) Int. Cl.
*H01L 29/267* (2006.01)
*H01L 21/24* (2006.01)

(56) References Cited

U.S. PATENT DOCUMENTS

| | | |
|---|---|---|
| 6,005,266 A | 12/1999 | Forrest et al. |
| 7,482,211 B2 | 1/2009 | Nieh et al. |
| 8,299,507 B2 | 10/2012 | Shimizu et al. |
| 8,377,832 B2 | 2/2013 | Takano et al. |
| 8,450,219 B2 | 5/2013 | Yang |
| 8,629,013 B2 | 1/2014 | Nieh et al. |
| 8,790,982 B2 | 7/2014 | Li et al. |
| 8,796,734 B2 | 8/2014 | Lochtefeld et al. |
| 8,816,391 B2 | 8/2014 | Ko et al. |
| 8,829,567 B2 | 9/2014 | Lee et al. |
| 9,177,791 B2* | 11/2015 | Ahmed ............... C23C 14/021 |
| 2014/0175618 A1 | 6/2014 | Mujumdar |
| 2014/0183597 A1 | 7/2014 | Lee et al. |
| 2014/0246696 A1* | 9/2014 | Flachowsky ........ H01L 29/7848 257/190 |
| 2014/0252414 A1 | 9/2014 | Merckling et al. |
| 2015/0255575 A1* | 9/2015 | Wang ..................... H01L 29/20 257/288 |

\* cited by examiner

DOPED ZINC OXIDE AND N-DOPING TO REDUCE JUNCTION LEAKAGE

BACKGROUND

Technical Field

The present invention relates to semiconductor devices and processes, and more particularly to semiconductor devices that employ doped ZnO and n– doping to reduce junction leakage in metal oxide semiconductor devices.

Description of the Related Art

Field effect transistors (FETs) which employ III-V materials, such as GaAs, InP or InGaAs substrates, often include a doped source and drain region made of a similar material. In one common structure, III-V FETs include source/drain (S/D) regions formed from doped InGaAs (e.g., n+ InGaAs). n+ InGaAs is not ideal for S/D regions. In InGaAs nFETs, the n+ InGaAs S/D regions suffer from a low doping concentration (e.g., $1 \times 10^{19}$ cm$^{-3}$). In addition, there is relatively high junction leakage and high contact resistance in InGaAs S/D regions. Further, the formation process requires patterned implantation of n+ dopants, which adds time and expense to the process, and may result in junction damage.

SUMMARY

A semiconductor device includes a substrate and a p-doped layer including a doped III-V material on the substrate. An n-doped layer is formed on the p-doped layer, the n-doped layer including a doped III-V material. A contact interface layer is formed on the n-doped layer. The contact interface layer includes a II-VI material. A contact metal is formed on the contact interface layer to form an electronic device.

Another semiconductor device includes a substrate, a p-doped layer including a doped III-V material on the substrate and an n-doped layer formed on the p-doped layer. The n-doped layer includes a doped III-V material. A contact interface is formed on or in the n-doped layer including a reaction product layer between material of the n-doped layer and a II-VI material. A contact metal is formed on the contact interface to form an electronic device.

A method for forming a semiconductor device includes forming a p-doped layer including a doped III-V material on a substrate; forming an n-doped layer including a doped III-V material on the p-doped layer; and forming a contact interface layer on the n-doped layer, the contact interface layer including a II-VI material.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
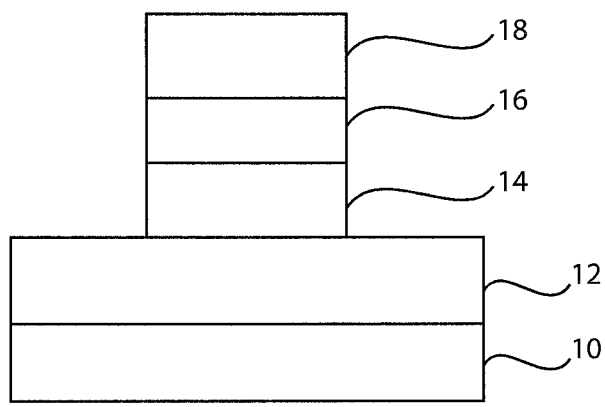
FIG. 1 is a cross-sectional view of a partially fabricated diode having a II-VI type material (e.g., ZnO) as a contact interface in accordance with the present principles.

In accordance with the present principles, electronic devices, structures and methods for formation are described for employing n-type doped semiconductor materials (e.g., Al doped ZnO (AZO)) with III-V semiconductor materials to improve performance and address the drawbacks of conventional structures. Doped ZnO, and in particular, n$^+$ Al-doped ZnO (ZnO:Al or AZO) provides a material, which can be formed on source and drain regions or active layers in diodes, etc. ZnO:Al has a similar electron affinity (~4.35-~4.4 eV) as n+ InGaAs, which is ~4.5 eV. ZnO:Al also has a greater doping level that can be obtained, for example, up to about $5 \times 10^{21}$/cm$^3$. ZnO:Al processing is more compatible with metallization processing.

While ZnO:Al is more compatible with metal material, the use of ZnO:Al may be difficult in metal oxide semiconductor field effect transistors (MOSFET) with III-V materials since the AZO has no deposition selectivity, and conformally covers side walls (of a resist or other structures). In addition, using AZO during multiple patterning steps with one mask may lead to disconnected channels due to misalignment from the AZO.

In one example, instead of epitaxial growth processes with patterned doping (e.g., with n+ InGaAs), ZnO:Al may be formed using atomic layer deposition (ALD), although other processes may be employed. This permits a doped layer with less surface damage. Materials like Al may be formed directly on the ZnO and be annealed to cause diffusion of the Al to dope the ZnO. In one embodiment, a layer of AZO is deposited over a field effect transistor (FET) for selective deposition on source and drain regions (S/D regions), e.g., InGaAs S/D regions. The AZO layer may be stripped off or left in place. A reaction product from the AZO layer and/or the layer of AZO itself promotes a greater reduction in current leakage and therefore better device performance for FETs. Improved diodes and other structures are also provided in accordance with the present principles.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip in accordance with the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., InP, InGaAs, ZnO, etc. These compounds may include different proportions of the elements within the compound, e.g., InGaAs includes $In_x$, $Ga_{1-x}As$, where x is less than or equal to 1, or ZnO includes $Zn_xO_{1-x}$ where x is less than or equal to 1, etc. In addition, other elements may be included in the compound, such as, e.g., ZnO:Al, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-section of a diode 30 is shown in accordance with one illustrative example. The diode 30 includes a substrate 10, a p-doped layer 12 and an n-doped layer 14. While the structure described and shown in accordance with the present principles is particularly useful for n-type diodes, doping changes and materials may be adjusted to implement the present principles in p-type devices as well. In one embodiment, the substrate 10 may include a III-V material, such as InP, although a Si wafer or substrate may also be employed, as well as other materials. The p-doped layer 12 may include a p-doped III-V layer (p−). In one embodiment, InGaAs may be employed.

In accordance with useful embodiments, a III-V material may be employed for n-doped layer 14 (n−). The n-type layer may include InGaAs (n−) or other III-V material. In one particularly useful embodiment, the n-type layer 14 includes a same base material as the p-type layer 12.

A doped contact interface layer 16 includes a high band gap II-VI material. A high band gap material has a band gap greater than about 1.0 eV and preferably greater than 2.0 eV. Interface layer 16 preferably includes ZnO and, in particular, an n+ ZnO:Al deposited by atomic layer deposition (ALD), although other formation processes may be employed, e.g., metal organic chemical vapor deposition (MOCVD), sputtering, epitaxy, etc. The ALD process forms the layer 16 and provides less surface damage to underlying layers including layer 14.

The carrier concentration (electron density) of the layer 14 may be between about $1\times10^{16}$ $cm^{-3}$ to about $2\times10^{19}$ $cm^{-3}$, and preferably about $2.0\times10^{17}$ $cm^{-3}$ for n-type dopants in layer 14. The n-type dopants may include Si, Ge, S, Te, etc. The carrier concentration (hole density) of the layer 12 may also be between about $1\times10^{16}$ $cm^{-3}$ to about $2\times10^{19}$ cm$^{-3}$, and preferably about 2.0×10$^{17}$ cm$^{-3}$ for p-type dopants in layer 12. The p-type dopants may include, e.g., C, Zn, Be, Mg.

The interface contact layer 16 may include doped n+ doped Aluminum Zinc Oxide (ZnO:Al) (AZO). The layer 16 may include a thickness of between about 5 nm and 50 nm, with a thickness of about 30 nm being preferred. The carrier concentration (electron density) of the layer 16 may be between about 1×10$^{21}$ cm$^{-3}$ to about 5×10$^{21}$ cm$^{-3}$, and preferably about 3.0×10$^{21}$ cm$^{-3}$ for Al doped ZnO, although other n-type dopants may be employed, e.g., In, Ga, Cl, I, etc.

The contact interface layer 16 is preferably n-type (e.g., AZO). The addition of the contact interface layer 16 to a lightly doped (n−) layer 14 reduces diode leakage by a significant amount. The contact interface layer 16 may be heavily n-doped ZnO with In, Ga, Al dopants or a heavily n-doped InGaZnO compound. In one embodiment, layer 16 can be removed and a diode 32 (FIG. 2) can be formed without the contact interface layer.

The n-doped layer 14 and contact interface layer 16 are preferably crystalline in form. This includes a monocrystalline structure and may include a multi-crystal structure or other crystalline structure (micro, nano, etc.). However, the AZO material of layer 16 may also include amorphous phases. In one embodiment, the ZnO of layer 16 is amorphous. The underlying layers, e.g., p-doped layer 12 and substrate 10 are also preferably crystalline, but may include other phases.

A contact 18 is formed on layer 16. The contact 18 may include a wider range of materials over conventional devices due to the use of layer 16. For example, the diode 30 may include metal contacts, e.g., Al and/or Au, alone or together in a bi-layer structure. An Al liner may be placed on the layer 16 followed by a highly conductive material such as Au or Pt. Other metals or combinations of metals are also contemplated. The Al of contact 18 may be employed to dope ZnO. The Al can increase the doping in AZO by annealing (e.g., at 400-450 degrees C. in an inert gas environment such as Ar, N$_2$, H$_2$, etc.).

Figure 2:
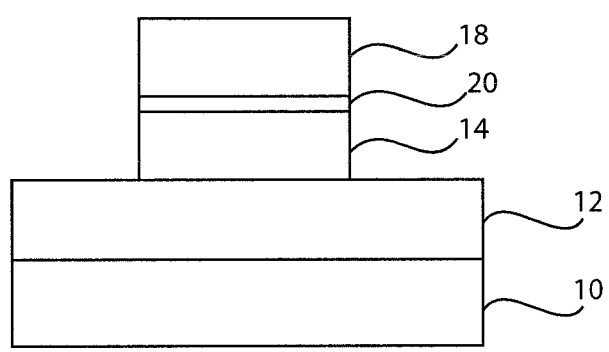
FIG. 2 is a cross-sectional view of a partially fabricated diode having a reaction product layer formed using II-VI type material (e.g., ZnO) as a contact interface in accordance with the present principles.

Referring to FIG. 2, a cross-section of another diode 32 is shown in accordance with another illustrative example. The diode 32 includes a substrate 10, a p-doped layer 12 and an n-doped layer 14. While the structure described and shown in accordance with the present principles is particularly useful for n-type diodes, doping changes and materials may be adjusted to implement the present principles in p-type devices as well. In one embodiment, the substrate 10 may include III-V materials, such as InP, Si or other suitable materials. The p-doped layer 12 may include a III-V material and, in particular, a p-doped InGaAs layer although other III-V materials may be employed.

In accordance with useful embodiments, a III-V material may be employed for n-type layer 14. A reaction product layer 20 is formed on the n-type layer 14. The reaction product layer 20 is formed by applying an n-type material (e.g., a high band gap II-VI material) on layer 14 and may include ZnO, indium tin oxide (ITO), etc. and preferably n+ ZnO:Al deposited by ALD or other process, e.g., MOCVD, sputtering, epitaxy, etc. The deposited n-type material may include a thickness of up to about 100 nm. The reaction product layer 20 may include InGaZnO or other alloy. The reaction product layer 20 is formed by depositing and then removing, by etching or other process, the n-type material, e.g., a ZnO layer (not shown) on the InGaAs of layer 14. An anneal process may be employed, e.g., at 400-450 degrees C. in an inert gas environment such as Ar, N$_2$, H$_2$, etc. to drive in reaction products. The reaction product layer 20 may include a thickness of between about 1 nm to about 30 nm.

A contact 18 is formed over reaction product layer 20. The contact 18 may include, for example, metal contacts in single or a bi-layer structure and may include, e.g., Al and/or Au. An Al liner may be placed on the reaction product layer 20 followed by a highly conductive material such as Au or Pt. Other metals or combinations of metals are also contemplated.

Figure 3:
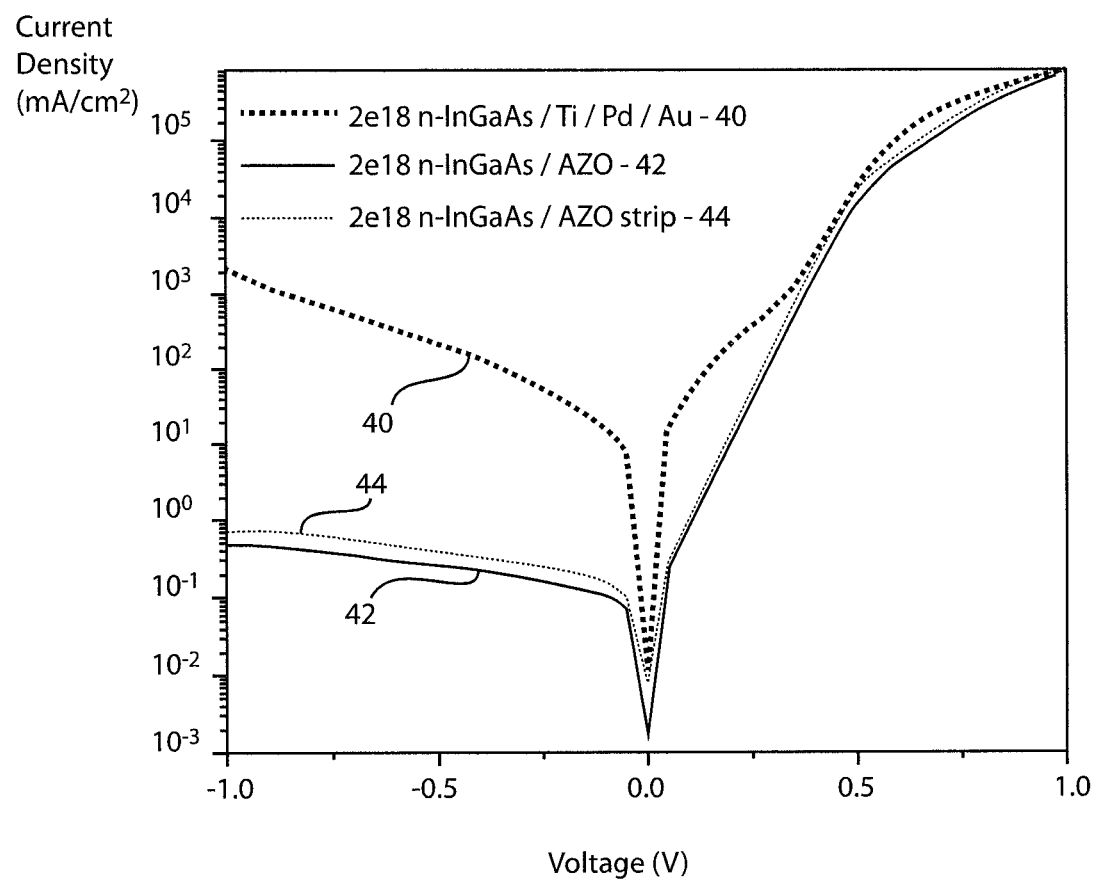
FIG. 3 is a current density-voltage graph plotting device current density (mA/cm$^2$) versus device voltage (volts) for three devices showing improved current leakage characteristics in accordance with the present principles.

Referring to FIG. 3, a current density-voltage graph plots device current density (mA/cm$^2$) versus device voltage (volts) for three devices. Leakage current is quantified by the magnitude of current density for negative voltages in this scenario. One plot 40 corresponds to a device that includes an InP substrate having a p− InGaAs layer (p−) on the substrate, and an n− InGaAs layer (n−) on the p− InGaAs layer. A metal contact formed on the n− InGaAs layer includes Ti/Pd/Au. The n− InGaAs layer has a dopant concentration of about 2×10$^{18}$ cm$^{-3}$. This structure (plot 40) is a conventional structure and is provided for comparison to the diode structures in accordance with the present principles that are illustrated in plots 42 and 44.

Plot 42 shows a diode having the structure described in FIG. 1 with an AZO (n+ ZnO:Al) layer formed on an n− InGaAs layer. The n− InGaAs layer has a dopant concentration of about 2×10$^{18}$ cm$^{-3}$. Plot 44 shows a diode having the structure described in FIG. 2 with an AZO (n+ ZnO:Al) layer formed on an n− InGaAs layer and then removed (stripped) leaving behind a reaction product layer. The n− InGaAs layer has a dopant concentration of about 2×10$^{18}$ cm$^{-3}$. As can be seen from the graph, the diodes in accordance with the present principles, plots 42 and 44, show a marked reduction in current density (current leakage) over that of the conventional structure in plot 40.

Referring to FIGS. 4-8, process steps are depicted for the formation of a field effect transistor (FET) in accordance with the present principles. The steps described herein with respect to the FET are applicable to diodes and other structures in accordance with the present principles.

Figure 4:
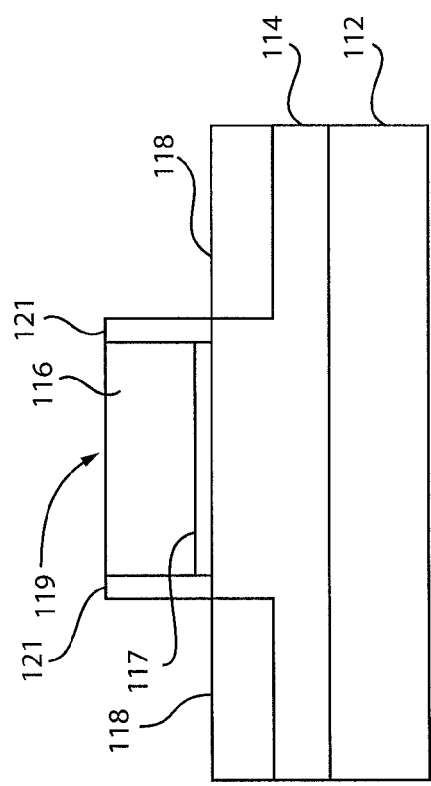
FIG. 4 is a cross-sectional view of a partially fabricated field effect transistor (FET) showing a formation of a gate conductor on a p-doped layer in accordance with the present principles.

Referring to FIG. 4, a cross-section of a partially fabricated field effect transistor (FET) 110 is shown in accordance with one illustrative example. The FET 110 includes a substrate 112, a p-doped layer 114 and a gate conductor 116. The FET 110 is processed by forming a gate dielectric 117, e.g., HfO$_2$, Al$_2$O$_3$, or other high dielectric constant material, and/or insulating layers. The gate electrode 116 is then formed. The gate electrode 116 may include any suitable highly conductive material, e.g., Cu, Cr, Au, Ag, etc. The gate conductor 116 and dielectric 117 are patterned to form a gate stack or structure 119. The gate structure 119 may include sidewall spacers 121 and/or other structures which are known in the art. While the structures described and shown in accordance with the present principles are particularly useful for n-FETs, doping changes and materials may be adjusted to implement the present principles in p-FET devices as well.

In one embodiment, the substrate 112 may include a III-V wafer, silicon material or other suitable material or wafer. The p-doped layer 114 may include a p-doped InGaAs layer although other III-V materials may be employed.

Figure 5:
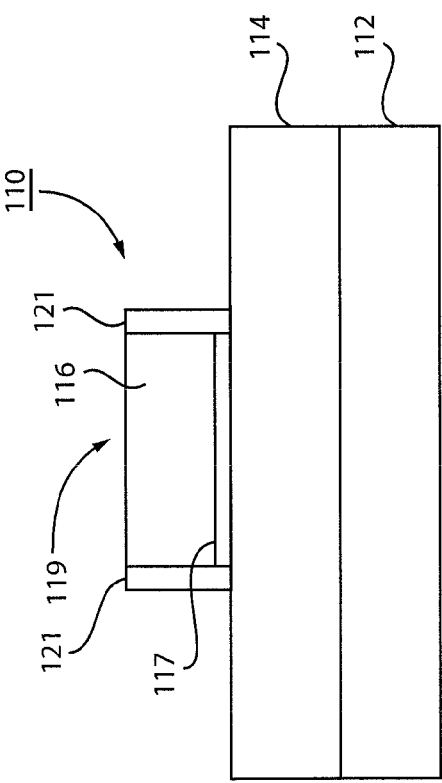
FIG. 5 is a cross-sectional view of the partially fabricated FET of FIG. 4 showing source and drain (S/D) regions formed by self-aligned implantation relative to a gate conductor in the p-doped layer to form n-doped regions in accordance with the present principles.

Referring to FIG. 5, source and drain (S/D) regions 118 are selectively formed relative to the gate conductor 116 by implanting a dopant into layer 114. In one embodiment, the dopant implanted to form regions 118 includes Si, Ge, S, Te although other dopants may be employed. The dopant concentration for S/D regions 118 may be between about 1×10$^{16}$ cm$^{-3}$ to about 5×10$^{19}$ cm$^{-3}$, and preferably about 2.0×10$^{18}$ cm$^{-3}$. The dopants in the S/D regions 118 may be activated by an anneal process or other known activation method.

Figure 6:
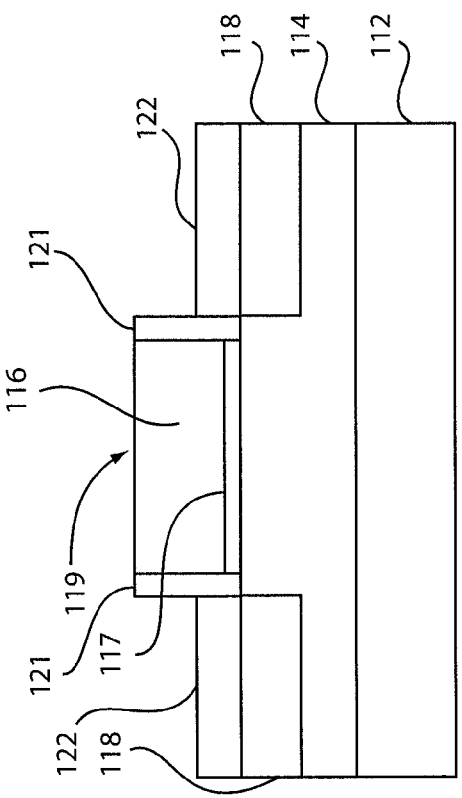
FIG. 6 is a cross-sectional view of the partially fabricated FET of FIG. 5 showing a II-VI layer formed over the gate conductor and the S/D regions in accordance with the present principles.

Referring to FIG. 6, a II-VI material 120 is deposited over the S/D regions 118 and over the gate stack (conductor 116, dielectric 117, spacers 121, etc.). In particular, an n-type material for material 120 includes a high band gap material, such as ZnO or its alloys. ZnO can be generically applied to III-V materials (e.g., S/D regions 118) with matching work functions. Material 120 has a preferred band gap of about 2 eV or more.

A range of n-doping in ZnO is up to 2 atomic percent (e.g., ~5×10$^{21}$/cm$^3$). ZnO dopants may include Al, Ga, In, Cl, I, etc., with Al being preferred. ZnO may be deposited or grown by one or more of the following processes, epitaxy, sputtering, ALD and MOCVD. The ZnO preferably includes n+ ZnO:Al deposited by ALD. The ALD process forms the material 120 on S/D regions 118 to provide less surface damage to S/D regions 118. The carrier concentration (electron density) of the material 120 may be between about 1×10$^{21}$ cm$^{-3}$ to about 5×10$^{21}$ cm$^{-3}$, and preferably about 3.0×10$^{21}$ cm$^{-3}$ for doped Aluminum Zinc Oxide (ZnO:Al) (AZO).

The n-type material 120 (e.g., ZnO:Al) is preferably crystalline in form. This includes a monocrystalline structure and may include a multi-crystal structure or other crystalline structure (micro, nano, etc.). However, the AZO material of layer 120 may also include amorphous phases. In one embodiment, the ZnO of layer 120 is amorphous. The underlying layers 118 are also preferably crystalline, but may include other phases.

Figure 7:
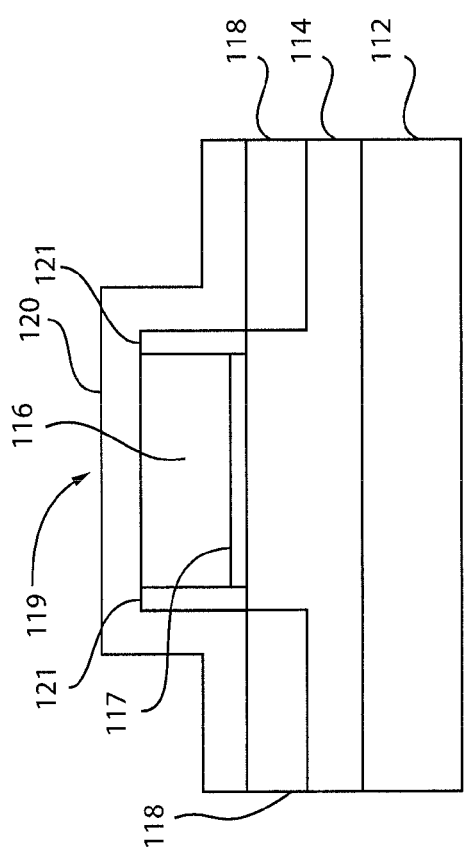
FIG. 7 is a cross-sectional view of the partially fabricated FET of FIG. 6 showing the II-VI layer removed over the gate conductor and remaining over the S/D regions in accordance with one embodiment.

Referring to FIG. 7, the n-type material 120 is removed from the gate stack 119. This may include patterning a resist or other type mask and etching the material over the gate stack 119 while the material 120 remains over the S/D regions 118 to form a contact interface layer 122. Processing continues to form contacts (see e.g., FIGS. 1 and 2) over the S/D regions 118 through a dielectric material as is known in the art. The contacts may include metal contacts in a bi-layer of, e.g., Al and Au. An Al liner may be placed on the contact interface layer 122 followed by a highly conductive material such as Au or Pt. Other metals or combinations of metals are also contemplated. The Al (or other metal layer) may be employed as a dopant source for doping or further doping the contact interface layer 122. An anneal process may be performed to assist in doping the S/D regions 118 with dopants form the contact interface layer 122 or doping the contact interface layer 122 with contact metals. Processing continues to complete the device 110.

Figure 8:
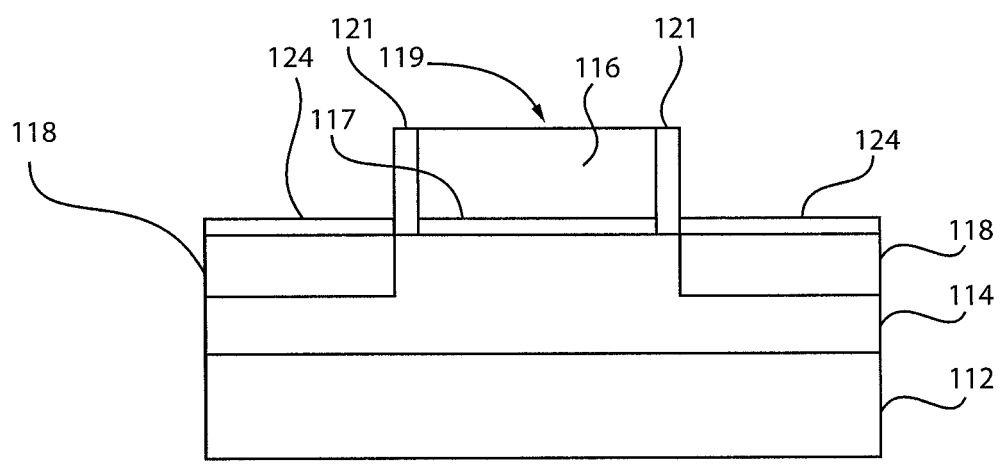
FIG. 8 is a cross-sectional view of the partially fabricated FET of FIG. 7 showing the II-VI layer removed over the gate conductor and the S/D regions but forming a reaction product layer in accordance with another embodiment.

Referring to FIG. 8, in another embodiment, the n-type material 120, preferably ZnO:Al, is removed from the gate stack 119 and the S/D regions 118. This may include etching the material 120 over the gate stack 119 and the S/D regions 118. A reaction product region(s)/contact interface 124 is/are formed and remain(s) on and in the S/D regions 118 to form a contact interface. Processing continues to form contacts (see e.g., FIGS. 1 and 2) over the S/D regions 118 through a dielectric material as is known in the art. The contacts may include metal contacts in a bi-layer of, e.g., Al and Au. An Al liner may be placed on the contact interface 124 followed by a highly conductive material such as Au or Pt. Other metals or combinations of metals are also contemplated. The Al (or other metal layer) may be employed as a dopant source for doping or further doping the contact interface 124.

An anneal process, e.g., at 400-450 degrees C. in an inert gas environment such as Ar, N$_2$, H$_2$, etc. may be performed to assist in the formation of the reaction product region 124 when layer 120 is present or after layer 120 has been stripped to drive in the atoms for the layer 120. In a particularly useful embodiment, S/D regions 118 include n-doped InGaAs and materials 120 include n+ ZnO. In such an instance, the reaction product layer 124 includes n+ InGaZnO. The reaction product region 124 includes n+ dopants to form an n+ doped region in or on the S/D regions 118. The reaction product region 124 may include a thickness of between about 1 nm to about 30 nm.

In other embodiments, the reaction product region 124 may be formed and the layer 122 left intact. In the embodiments described in FIGS. 4-8, the S/D regions may include a doping concentration between about 1×10$^{16}$ cm$^{-3}$ to about 2×10$^{19}$ cm$^{-3}$. While other doping concentrations are contemplated, the inventors have discovered that lower doping concentrations have significantly reduced device leakage for p-n junction devices including transistor devices and diodes, as will be described.

Figure 9:
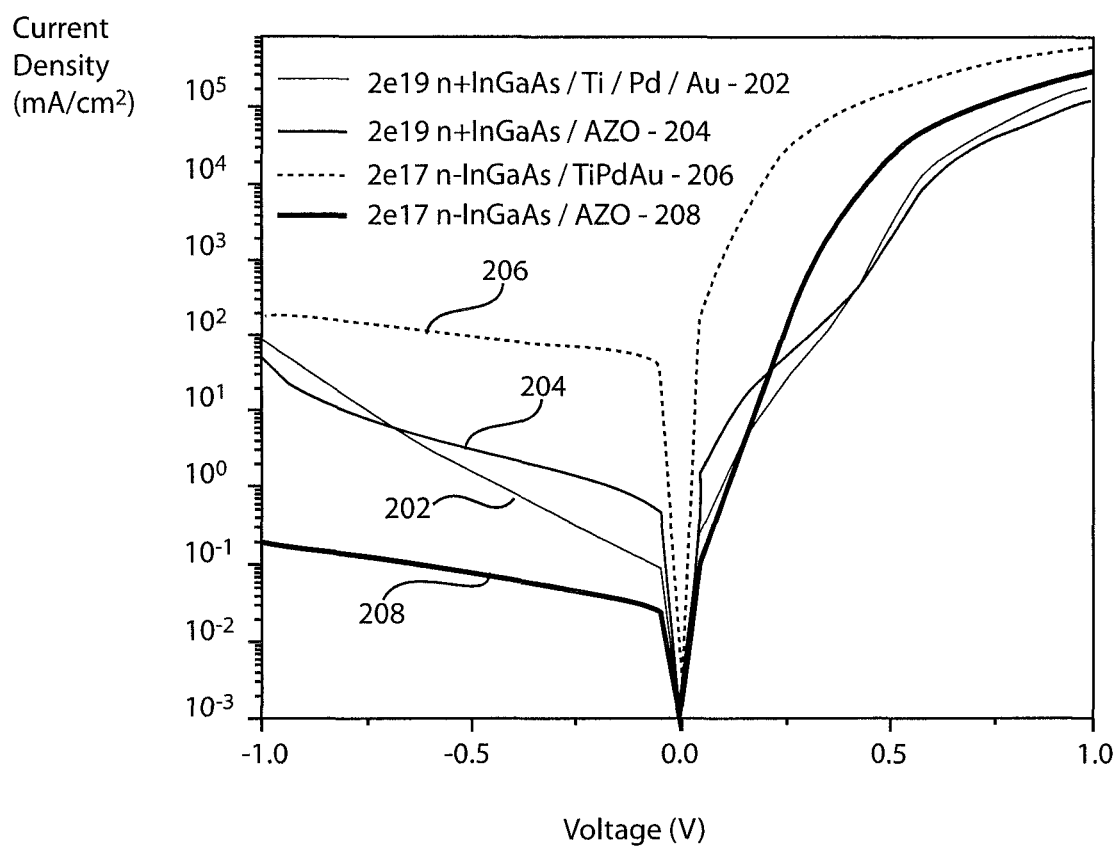
FIG. 9 is a current density-voltage graph plotting device current density (mA/cm$^2$) versus device voltage (volts) for four devices showing improved current leakage characteristics with decreased doping concentration of an n– doped layer with the addition of a II-VI material formed on the n-doped layer in accordance with the present principles.

Referring to FIG. 9, a current density-voltage graph plots device current density (mA/cm$^2$) versus device voltage (volts) for four diode devices showing the effects of n-type doping on diode performance with or without AZO. Leakage current is quantified by the magnitude of current density for negative voltages in this scenario. One plot 202 corresponds to a device that includes an InP substrate having a p-InGaAs layer (p−) on the substrate, and an n+ InGaAs layer on the p− InGaAs layer. A metal contact formed on the n+ InGaAs layer includes Ti/Pd/Au. The n+ InGaAs layer has a dopant concentration of about 2×10$^{19}$ cm$^{-3}$. This structure is provided for comparison to the diode structures with AZO shown in plot 204.

Plot 204 corresponds to a device that includes an InP substrate having a p-InGaAs layer (p−) on the substrate, and an n+ InGaAs layer on the p− InGaAs layer. A metal contact formed on the n+ InGaAs layer includes AZO. The n+ InGaAs layer has a dopant concentration of about 2×10$^{19}$ cm$^{-3}$. The structure of plot 204 provides comparable current leakage to that of plot 202.

Plot 206 corresponds to a device that includes an InP substrate having a p-InGaAs layer (p−) on the substrate, and an n− InGaAs layer (n−) on the p− InGaAs layer. A metal contact formed on the n− InGaAs layer includes Ti/Pd/Au. The n− InGaAs layer has a dopant concentration of about 2×10$^{17}$ cm$^{-3}$.

Plot 208 corresponds to a device that includes an InP substrate having a p-InGaAs layer (p−) on the substrate, and an n− InGaAs layer (n−) on the p− InGaAs layer. A metal contact interface is formed on the n− InGaAs layer and includes AZO. The n-InGaAs layer has a dopant concentration of 2×10$^{17}$ cm$^{-3}$. With AZO and the lower n-doping in the S/D regions, the current leakage for the device of plot 208 is at least three orders of magnitude less than that of the device in plot 206. In addition, the current leakage performance is vastly better than the higher doped device including AZO (plot 204) and the higher doped Ti/Pd/Au device (plot 202).

Figure 10:
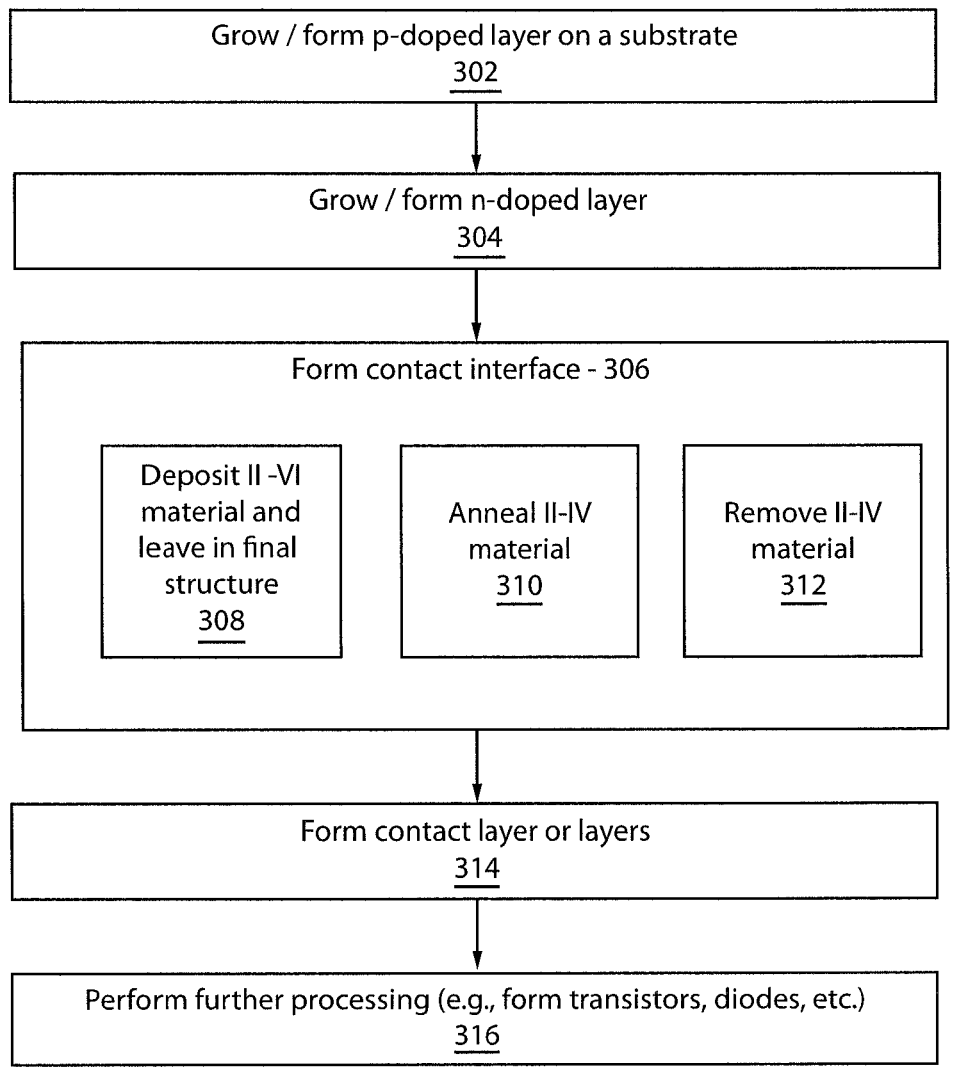
FIG. 10 is a block/flow diagram showing methods for forming a semiconductor device in accordance with illustrative embodiments.

Referring to FIG. 10, a method for forming a semiconductor device is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 302, a p-doped layer is grown or formed on a substrate, e.g., III-V substrate, Si substrate, Ge substrate, etc. The p-doped layer preferably includes a III-V material. III-V materials may include, e.g., InP, InAs, AlAs, AlN, GaN, InN, AlP, GaP, InP, AlAs, GaAs, InAs, etc. or tertiary compounds, e.g., InGaAs, AlGaAs, etc.

In block 304, an n-doped layer is grown or formed on the p-doped layer. The n-doped layer preferably includes a III-V material. III-V materials may include, e.g., InP, InAs, AlAs, AlN, GaN, InN, AlP, GaP, InP, AlAs, GaAs, InAs, etc. or tertiary compounds, e.g., InGaAs, AlGaAs, etc. The n-doped layer (n−) preferably includes a carrier concentration of between about $1 \times 10^{16}$ cm$^{-3}$ to about $2 \times 10^{19}$ cm$^{-3}$.

In block 306, a contact interface is formed on the n-doped layer. In one embodiment, the contact interface includes a deposited II-VI material. The deposition process may include ALD, MOCVD, although other processes may be employed. The II-VI material may include n+ doped. ZnO (e.g., ZnO:Al), although other suitable material may be employed, e.g., ITO.

II-VI material, such as ZnO or ITO, may also be formed on the n-doped layer by employing sputtering, epitaxial growth, etc. The n-doped layer is formed with (or will be processed to have) a carrier concentration of between about $1 \times 10^{16}$ cm$^{-3}$ to about $2 \times 10^{19}$ cm$^{-3}$, preferably about $1\text{-}2 \times 10^{17}$ cm$^{-3}$. ALD is preferable and results in minimal surface damage to the underlying layers.

In block 308, the II-VI material may remain on the n-doped region. The II-VI material will be employed in the final structure of the device. An optional anneal may be performed, In block 310, the contact interface is annealed to form a reaction product layer between the n-doped layer and the II-VI material. This may be to form a contact interface or to improve device characteristics. For example, the anneal process may include a rapid thermal anneal (RTA) at between about 200 degrees C. to about 600 degrees C. for less than one minute. In one embodiment, the RTA includes a 300 degree C. anneal for about 30 seconds. Other anneal processes may also be employed, e.g., anneal at 400-450 degrees C. in an inert gas environment such as Ar, N$_2$, H$_2$, etc. If the anneal is to form the contact interface layer, the II-VI material may optionally be removed after the anneal. The II-VI material may be employed in the final structure of the device.

In another embodiment, in block 312, the II-VI material is removed (stripped). The reaction product layer remains (with or without the II-VI layer) and may include a mixture of materials from the II-VI layer and the n-doped layer. For example, the n-doped layer may include InGaAs and the II-VI material may include ZnO, then the reaction product layer may include n+ doped InGaZnO. An optional anneal process may be performed before stripping, e.g., at 400-450 degrees C. in an inert gas environment such as Ar, N$_2$, H$_2$, etc. to assist in the formation of a reaction product region.

In block 314, a contact layer or contact layers are formed. The contact layers may include an aluminum contact layer formed on the II-VI material or the reaction product layer. The aluminum contact layer may be part of a bi-layer with another metal or metals deposited thereon. The contact layer may be employed as a dopant source to underlying layers.

In block 316, the structure may be patterned or otherwise further processed to form a device. The device may include a transistor, diode, etc. Further processing may include forming metallizations, etc.

Having described preferred embodiments for doped zinc oxide and n− doping to reduce junction leakage (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a substrate;
a p-doped layer including a doped III-V material on the substrate;
an n-doped layer formed on the p-doped layer, the n-doped layer including a doped III-V material;
a contact interface layer formed on the n-doped layer, the contact interface layer including a II-VI material having a higher n-doped concentration than the n-doped layer; and
a contact metal formed on the contact interface layer to form an electronic device.

2. The semiconductor device as recited in claim 1, wherein the contact interface layer includes doped ZnO deposited by an atomic layer deposition or epitaxially grown by metal organic chemical vapor deposition.

3. The semiconductor device as recited in claim 1, wherein the n-doped layer includes a carrier concentration of between about $1 \times 10^{16}$ cm$^{-3}$ to about $2 \times 10^{19}$ cm$^{-3}$.

4. The semiconductor device as recited in claim 1, wherein the contact interface layer includes n+ doped ZnO.

5. The semiconductor device as recited in claim 1, wherein the n-doped layer forms source and drain regions for a field effect transistor.

6. The semiconductor device as recited in claim 1, wherein the n-doped layer forms a diode junction with the p-doped layer.

7. The semiconductor device as recited in claim 1, wherein the n-doped layer and the p-doped layer include InGaAs.

8. A semiconductor device, comprising:
a substrate;
a p-doped layer including a doped III-V material on the substrate;
an n-doped layer formed on the p-doped layer, the n-doped layer including a doped III-V material;
a contact interface formed on or in the n-doped layer including a reaction product layer between material of the n-doped layer and a II-VI material; and
a contact metal formed on the contact interface to form an electronic device.

9. The semiconductor device as recited in claim 8, wherein the reaction product layer includes n+ dopants.

10. The semiconductor device as recited in claim 8, wherein the n-doped layer includes a carrier concentration of between about $1 \times 10^{16}$ cm$^{-3}$ to about $2 \times 10^{19}$ cm$^{-3}$.

11. The semiconductor device as recited in claim 8, wherein the contact interface includes an n+ doped ZnO alloy.

12. The semiconductor device as recited in claim 8, wherein the n-doped layer forms source and drain regions for a field effect transistor.

13. The semiconductor device as recited in claim 8, wherein the n-doped layer forms a diode junction with the p-doped layer.

14. The semiconductor device as recited in claim 8, wherein the n-doped layer and the p-doped layer include InGaAs.

15. A method for forming a semiconductor device, comprising:
   forming a p-doped layer including a doped III-V material on a substrate;
   forming an n-doped layer including a doped III-V material on the p-doped layer; and
   forming a contact interface layer on the n-doped layer, the contact interface layer including a II-VI material having a higher n-doped concentration than the n-doped layer.

16. The method as recited in claim 15, wherein the n-doped layer includes a carrier concentration of between about $1 \times 10^{16}$ cm$^{-3}$ to about $2 \times 10^{19}$ cm$^{-3}$.

17. The method as recited in claim 15, further comprising:
   annealing the contact interface layer to form a reaction product layer between the n-doped layer and the contact interface layer; and
   removing the contact interface layer.

18. The method as recited in claim 17, wherein the reaction product layer includes n+ dopants.

19. The method as recited in claim 17, wherein the reaction product layer includes a ZnO alloy.

20. The method as recited in claim 15, wherein the contact interface layer includes n+ doped ZnO.

* * * * *